United States Patent [19]

Farmer, Jr.

[11] 4,088,947
[45] May 9, 1978

[54] ELECTRICAL CONTINUITY TEST APPARATUS HAVING A FORWARD BIASED DIODE ACROSS THE TEST TERMINALS

[75] Inventor: Felta Carl Farmer, Jr., Marion, Ind.

[73] Assignee: RCA Corporation, New York, N.Y.

[21] Appl. No.: 692,497

[22] Filed: Jun. 3, 1976

[51] Int. Cl.² ............................................. G01R 31/02
[52] U.S. Cl. ..................................................... 324/51
[58] Field of Search ..................... 324/51, 133, 62, 64, 324/132; 340/256, 244 C, 248 R

[56] References Cited

U.S. PATENT DOCUMENTS

| | | | |
|---|---|---|---|
| 2,645,754 | 7/1953 | Pitinsky | 324/51 |
| 2,699,528 | 1/1955 | Periale | 324/51 X |
| 3,339,578 | 9/1967 | Smith | 340/244 C |
| 3,345,565 | 10/1967 | Cotter | 324/51 |
| 3,525,038 | 8/1970 | Felt et al. | 340/256 X |
| 3,590,370 | 6/1971 | Fleischer | 324/51 |
| 3,783,372 | 1/1974 | Boyd | 324/51 X |
| 3,829,849 | 8/1974 | Stauffer | 340/256 X |
| 3,845,388 | 10/1974 | Ley et al. | 324/132 X |

FOREIGN PATENT DOCUMENTS

| | | | |
|---|---|---|---|
| 897,938 | 5/1962 | United Kingdom | 324/51 |
| 1,330,412 | 9/1973 | United Kingdom | 324/51 |

OTHER PUBLICATIONS

Cann, G. W., Continuity Tester, IBM Tech. Discl. Bulletin, vol. 7, No. 12, May, 1965.

*Primary Examiner*—Gerard R. Strecker
*Attorney, Agent, or Firm*—Glenn H. Bruestle; William H. Murray; Dennis H. Irlbeck

[57] ABSTRACT

Electrical continuity between two points is measured by electrically connecting a diode between the two points. A dc voltage is applied across the diode, with the positive voltage being connected to the anode of the diode and the negative voltage being connected to the cathode. The largest voltage which appears across the two measurement points is equal to the voltage drop across the diode. An operational amplifier senses and amplifies the voltage appearing between the two measurement points. If this voltage exceeds a certain maximum value, a light emitting diode is turned on to indicate that there is no continuity between the measurement points.

8 Claims, 1 Drawing Figure

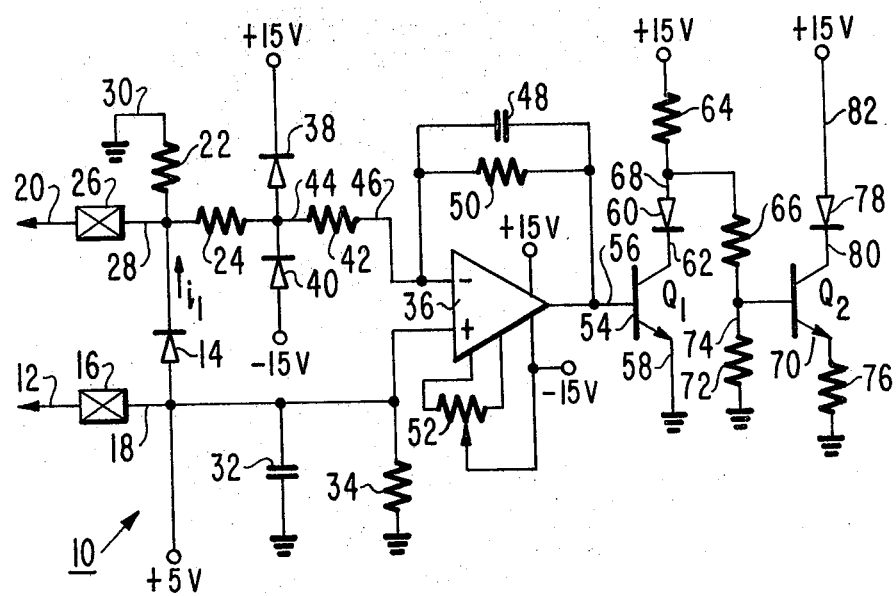

ELECTRICAL CONTINUITY TEST APPARATUS HAVING A FORWARD BIASED DIODE ACROSS THE TEST TERMINALS

BACKGROUND OF THE INVENTION

The present invention relates to a continuity test apparatus, and more particularly to a continuity test apparatus wherein the applied test voltage is less than one volt.

The design of some electron guns for use in conventional color television picture tubes incorporate electrodes, some of which are fabricated in parts which are subsequently welded together. For example, a first accelerating and focusing electrode might comprise two rectangular shaped cups which are welded together at their open ends in order to maintain good electrical contact therebetween.

It has been found in the past that the use of a conventional continuity tester would occasionally yield erroneous indications of continuity because the test voltage applied was too high. For example, when measuring continuity between the two cups which form the first accelerating and focusing electrode, the application of even a few volts between the two cups was sometimes sufficient to "bridge the gap" thereby giving a false indication of continuity on unwelded assemblies. In other words, this equipment had a terminal voltage which would give false reading of electrical continuity on unwelded electrodes which were merely in close physical contact.

SUMMARY OF THE INVENTION

An apparatus for detecting electrical continuity between two measurement points comprises a pair of measurement terminals. Each measurement terminal is capable of being electrically connected to a different one of the measurement points. A diode is coupled between the measurement terminals. One terminal of a resistor, having two terminals, is electrically connected to one of the measurement terminals. Also included are means for electrically connecting a dc power supply between the other terminal of the resistor and the other measurement terminal so as to forward bias the diode, as well as means for measuring a voltage between the measurement terminals.

BRIEF DESCRIPTION OF THE DRAWING

The FIGURE is a schematic diagram of the apparatus of the present invention.

DETAILED DESCRIPTION OF THE INVENTION

Referring to the FIGURE, there is shown a schematic diagram of a continuity test apparatus of the present invention generally referred to as 10. The continuity test apparatus 10 includes a first measurement terminal 12 electrically coupled to an anode terminal of a first diode 14 through a ferrite bead 16 by means of one branch of a branching conductor 18. The ferrite bead is, for example, an RCA type 126874. The first diode 14 is, for example, a type 1N4004.

A second measurement terminal 20 is connected to a cathode terminal of the first diode 14 as well as a junction of a first resistor 22 and a second resistor 24 through a second ferrite bead 26 by means of one branch of a branching conductor 28. The other terminal of the first resistor 22 is connected to ground by a conductive path 30. The first resistor is, for example, a metal film type having a value of 1 megohm ± 1%. The second resistor 24 is, for example, a metal film type having a value of 10 ohms ± 1%.

The positive terminal of a first dc power supply (not shown) is electrically connected to the anode terminal of the first diode 14, one terminal of a first capacitor 32, one terminal of a third resistor 34 and a non-inverting input of an operational amplifier 36 by means of the branching conductor 18. The other side of the first capacitor 32 and the third resistor 34 are electrically connected to ground. The first capacitor 32 has a value of, for example, 0.047 microfarads. The third resistor is, for example, a metal film type having a value of one megohm ±1%. The operational amplifier 36 is, for example, a National Semiconductor Corporation Type LH0022 Operational Amplifier as described on pages 2–29 through 2–35 of the National Semiconductor Corporation, "Linear Integrated Circuits Catalog", February 1975 Edition.

The other terminal of the second resistor 24 is electrically connected to an anode terminal of a second diode 38, a cathode terminal of a third diode 40 and one terminal of a fourth resistor 42 by means of a branching conductor 44. The second and third diodes, 38 and 40, are each, for example, a type 1N4004. The fourth resistor 42 is, for example, a metal film type having a value of 47 ohms ± 1%.

The other terminal of the fourth resistor 42 is electrically connected to an inverting input of the operational amplifier 36 through one branch of a branching conductor 46. A second capacitor 48 and a fifth resistor 50 are connected in parallel between the inverting input and an output of the operational amplifier 36. The second capacitor 48 has a value of, for example, 0.01 microfarads. The fifth resistor 50 is, for example, a metal film type having a resistance value of 0.1 megohm ± 1%.

A potentiometer 52 is connected between a pair of offset null terminals of the operational amplifier 36. A negative supply voltage, for example, −15 volts, is connected to the wiper of the potentiometer 52 and to the negative supply voltage terminal of the operational amplifier 36. A positive supply voltage, for example, +15 volts, is connected to the positive supply voltage terminal of the operational amplifier 36.

The output of the operational amplifier 36 is electrically connected to the base of a first transistor 54 through one branch of a branching conductor 56. The emitter electrode of the first transistor 54 is electrically connected to ground through a conductive path 58. The collector electrode of the first transistor 54 is electrically connected to the cathode terminal of a first light emitting diode (LED) 60 through a conductive path 62. The anode terminal of the first LED 60 is electrically connected to a junction of a sixth resistor 64 and a seventh resistor 66 through a conductive path 68. The other terminal of the sixth resistor 64 is electrically connected to a positive supply voltage, for example, +15 volts. The first transistor 54 is, for example, a type 2N3567. The first light emitting diode 60, is, for example, a type XCITON XC556-2. The sixth resistor 64 is, for example, a metal film resistor having a value of 180 ohms ± 1%. The seventh resistor 66 is, for example, a metal film type having a resistance of 4.7K ohms ± 1%.

The other terminal of the seventh resistor 66 is electrically connected to the base electrode of a second transistor 70 and one terminal of an eighth resistor 72 by means of a branching conductive path 74. The other terminal of the eighth resistor 72 is connected to ground. The eighth resistor 72 is, for example, a metal film type having a value of 680 ohms ± 1%. The second transistor 70 is, for example, a type 2N3567.

The emitter electrode of the second transistor 70 is electrically connected to ground through a ninth resistor 76. The ninth resistor 76 is, for example, a metal film type having a resistance of 180 ohms ± 1%. The collector electrode of the second transistor 70 is electrically connected to the cathode terminal of a second light emitting diode 78 through a conductive path 80. The anode electrode of the second light emitting diode 78 is electrically connected to a positive supply voltage, for example +15 volts, through a conductive path 82. The second light emitting diode 78 is, for example, a type XCITON XC556G-2.

The operation of the electrical continuity test apparatus 10 is as follows. The +5 volts applied to the anode terminal of the first diode 14 causes a first current ($i_1$) to flow through the first diode 14 and the first resistor 22. The voltage drop across the first diode 14 is approximately 0.6 volt and is the voltage that appears between the first 12 and second 20 measurement terminals. The first and second measurement terminals 12 and 20 are electrically connected to two measurement points in order to detect electrical continuity therebetween. As a result, the 0.6 voltage drop across the first diode 14 is applied between the two measurement points. When an open circuit exists between the two measurement points, $i_1 = (5V - 0.6V) \div 1 \times 10^6 \Omega = 4.4 \times 10^{-6} A$. The 0.6 volt drop across the first diode 14 will appear between the inverting and non-inverting inputs of the operational amplifier 36. The gain of the operational amplifier 36 is determined by selecting a particular resistance value for the feedback resistor, which is the fifth resistor 50 in the schematic shown in the FIGURE. In the embodiment described herein, the resistance value of the feedback resistor 50 is $1 \times 10^5 \Omega$; consequently, the gain of the operational amplifier 36 is substantially equal to $1 \times 10^5$. As a result, with 0.6 volt across the inverting and non-inverting inputs, the output of the operational amplifier 36 will saturate at +15 volts ($0.6V \times 1 \times 10^5 >> 15V$). With +15 volts applied to the base electrode, the first transistor 54 will turn on causing a current to flow through the first light emitting diode 60. This causes the first light emitting diode 60 to light, indicating that there is no continuity between the first and second measurement points. Since the first transistor 54 is conducting, the voltage at the anode of the first light emitting diode 60 is less than 2 volts. Consequently, the voltage appearing at the base electrode of the second transistor 70 is less than the required turn on voltage.

If there is electrical continuity, for example, one ohm or less between the first and second measurement points, the current flowing through the first resistor 22 is approximately equal to 5 volts ÷ [$1 \times 10^6$ ohm + 1 ohm] which is approximately equal to $5 \times 10^{-6}$ amp. Consequently, the voltage which appears across the first and second measurement terminals 12 and 20 is approximately equal to $5 \times 10^{-6}$ volts ($5 \times 10^{-6} A \times 1\Omega = 5 \times 10^{-6} V$). Consequently, the voltage appearing across the inverting and non-inverting inputs of the operational amplifier 36 will be approximately equal to $5 \times 10^{-6}$ volts. Since the gain of the operational amplifier is $1 \times 10^5$, the voltage appearing at the output of the operational amplifier 36 is equal to $5 \times 10^{-6} V \times 1 \times 10^5$ which is equal to 0.5 volt. Since 0.5 volt is less than the base voltage required to turn on the first transistor 54, the first light emitting diode 60 will turn off. Since the first transistor 54 is not conducting, the voltage appearing at the base electrode of the second transistor 70 is approximately equal to 1.8 volts which is greater than the turn-on voltage of the second transistor 70. Consequently, the second transistor 70 will turn-on causing current to flow through the second light emitting diode 78, which will then light, indicating the existance of a conductive path having a resistance of 1 ohm or less, between the first and second measurement points.

As indicated in the above description, the maximum voltage that this apparatus applies between the two measurement points cannot exceed a forward voltage drop across the first diode 14, a voltage which is approximately equal to 0.6 volt. This low voltage, when applied to electrode components which are in close physical contact but which have not been adequately welded together, will not cause any "bridging the gap" which in turn would cause erroneous indications of continuity between the components.

I claim:

1. An apparatus for detecting electrical continuity between two measurement points comprising:
   a. a pair of measurement terminals, each capable of being electrically connected to a different one of said measurement points;
   b. a diode coupled between said measurement terminals;
   c. a resistor having two terminals, one of which is electrically connected to one of said measurement terminals;
   d. means for electrically connecting a dc power supply between the other terminal of said resistor and the other of said measurement terminals so as to forward bias said diode, whereby the voltage across said measurement terminals is limited to the forward bias drop across said diode;
   e. means for measuring a voltage between said measurement terminals;
   f. first visual indicating means connected to said means for measuring for indicating an open circuit between said measurement points; and
   g. second visual indicating means connected to said first visual indicating means for indicating a closed circuit between said measurement points.

2. An apparatus in accordance with claim 1 wherein said voltage measuring means comprises an operational amplifier having inverting and non-inverting inputs and an output, the inverting input being coupled to the cathode terminal of said diode, the non-inverting input being coupled to the anode terminal of said diode and the output being coupled to said first visual indicating means.

3. An apparatus in accordance with claim 2 wherein a direct current feedback path, including a feedback resistance R is connected between the output and the inverting input of said operational amplifier causing the gain of said amplifier to be substantially equal to R.

4. An apparatus in accordance with claim 3 wherein said first visual indicating means comprises
   a. a transistor having first and second main electrodes and a control electrode;
   b. light emitting means coupled to the first electrode of said transistor; and c. means for connecting a power supply across the light emitting means and the second main electrode of said transistor; and
d. means for electrically connecting the control electrode of said transistor to the output of said operational amplifier.

5. An apparatus in accordance with claim 4 wherein said light emitting means comprises a light emitting diode.

6. An apparatus in accordance with claim 5 wherein said transistor is of the NPN type and which said control electrode is the base of said transistor, said first main electrode is the collector of said transistor and said second main electrode is the emitter of said transistor.

7. An apparatus in accordance with claim 5 wherein said second visual indicating means comprises a light emitting diode.

8. An apparatus for detecting electrical continuity between two measurement points comprising:
a. a pair of measurement terminals, each capable of being electrically connected to a different one of said measurement points;
b. a diode coupled between said measurement terminals;
c. means including a resistor and d.c. source connected in series across said terminals for providing a forward bias voltage drop across said diode of approximately 0.6 volt;
d. means for amplifying the voltage drop across said diode; and
e. means responsive to the amplified voltage for visually indicating continuity between said two measurement points.

* * * * *